United States Patent
Hess et al.

(10) Patent No.: US 9,274,933 B2
(45) Date of Patent: Mar. 1, 2016

(54) PRETEST SETUP PLANNING

(71) Applicant: International Business Machines Corporation, Armonk, NY (US)

(72) Inventors: Howard M Hess, Winnetka, IL (US); Rachel Tzoref-Brill, Haifa (IL); Aviad Zlotnick, Mitzpeh Netofah (IL)

(73) Assignee: International Business Machines Corporation, Armon, NY (US)

( * ) Notice: Subject to any disclaimer, the term of this patent is extended or adjusted under 35 U.S.C. 154(b) by 0 days.

(21) Appl. No.: 14/243,908

(22) Filed: Apr. 3, 2014

(65) Prior Publication Data

US 2014/0317450 A1 Oct. 23, 2014

Related U.S. Application Data

(63) Continuation-in-part of application No. 13/676,110, filed on Nov. 14, 2012, now Pat. No. 8,887,112.

(51) Int. Cl.
*G06F 11/22* (2006.01)
*G06F 17/50* (2006.01)
*G06F 11/36* (2006.01)
*G01R 31/3183* (2006.01)

(52) U.S. Cl.
CPC .... *G06F 11/3684* (2013.01); *G01R 31/318314* (2013.01)

(58) Field of Classification Search
CPC ............ G06F 11/3664; G06F 11/3684; G06F 11/3672; G06F 11/3688; G06F 11/263; G06F 11/28; G06F 11/3676; G06F 11/3692; G06F 17/50; G06F 11/2294; G06F 11/368; G06F 11/3696; G06F 11/36; G06F 11/3604; G06F 11/3608; G06Q 10/063; G01R 31/31704; G01R 31/318314

See application file for complete search history.

(56) References Cited

U.S. PATENT DOCUMENTS

| | | |
|---|---|---|
| 2008/0172652 A1 | 7/2008 | Davia et al. |
| 2009/0307763 A1* | 12/2009 | Rawlins et al. .................... 726/5 |
| 2010/0287534 A1 | 11/2010 | Vangala et al. |
| 2011/0289488 A1 | 11/2011 | Ghosh |
| 2012/0144370 A1* | 6/2012 | Kemmler et al. ............. 717/124 |

* cited by examiner

*Primary Examiner* — Nha Nguyen
(74) *Attorney, Agent, or Firm* — Ziv Glazberg

(57) ABSTRACT

A computer-implemented method comprising: obtaining a description of a test suite which comprises a plurality of tests, wherein each test of the test suite is described by values of functional attributes, wherein at least a portion of the functional attributes are setup-related attributes, wherein a combination of values of the setup-relates attributes potentially indicate a setup activity to be performed prior to executing the test to set up a test environment for the test. Identifying, based on the description of the test suite, a setup activity that is associated with two or more tests, wherein the setup activity is configured to set up a component of the test environment, wherein the identifying is performed by a processor. Providing a first instruction to perform the setup activity prior to executing a first test of the two or more tests. And, providing a second instruction to reuse the component of the test environment when executing additional tests of the two or more tests, whereby avoiding performing duplicate setup activities.

19 Claims, 3 Drawing Sheets

_US 9,274,933 B2_

PRETEST SETUP PLANNING

CROSS-REFERENCE TO RELATED APPLICATION

This application is a Continuation In Part of U.S. Non-Provisional application Ser. No. 13/676,110 filed Nov. 14, 2012, entitled "TEST VALIDATION PLANNING", which is hereby incorporated by reference in its entirety.

TECHNICAL FIELD

The present disclosure relates to testing in general, and to pretest setup planning, in particular.

BACKGROUND

Omissions are a major risk in testing. Test planning techniques are a well-known way to improve the quality of testing by reducing omissions, redundancy and execution time. These techniques try to prevent omissions in advance (i.e., before tests are implemented and executed) by selecting what to test out of a possibly enormous test space, in a way that reduces as much as possible the risk of bugs escaping to the field. The selection of tests is also characterized in avoiding or reducing tests that are similar to one another and provide no added value. In some cases, three tests may have the same coverage as two tests, as the third test may overlap both two tests (e.g., a first part overlaps the first test and the rest of the test overlaps the second test).

For the purpose of testing, a model of the test space may be defined. The test space can represent inputs, scenarios, configurations, or any other aspect that one is interested in testing. The model comprises a set of functional attributes, respective domains of values for each attribute, and potentially restrictions on the value combinations. As an example, the test space may be defined by inputs formed as functional attributes and its values. This model may be used to determine the description of a test plan. The description may comprise coverage tasks, each having a value assigned to each functional attribute, and representing different setup activities to be performed prior to executing each test.

In some cases, Combinatorial Test Design (CTD) may be used to create a test plan based on a model which covers a desired coverage goal, which may be defined as a target level of interaction between the attributes. Additionally or alternatively, the test plan may be created manually, may be generated automatically using other techniques different than CTD, may be defined based on an existing test suite, or the like.

BRIEF SUMMARY

One exemplary embodiment of the disclosed subject matter is a computer-implemented method comprising: obtaining a description of a test suite which comprises a plurality of tests, wherein each test of the test suite is described by values of functional attributes, wherein at least a portion of the functional attributes are setup-related attributes, wherein a combination of values of the setup-relates attributes potentially indicate a setup activity to be performed prior to executing the test to set up a test environment for the test; identifying, based on the description of the test suite, a setup activity that is associated with two or more tests, wherein the setup activity is configured to set up a component of the test environment, wherein the identifying is performed by a processor; providing a first instruction to perform the setup activity prior to executing a first test of the two or more tests; and, providing a second instruction to reuse the component of the test environment when executing additional tests of the two or more tests, whereby avoiding performing duplicate setup activities.

Another exemplary embodiment of the disclosed subject matter is a computerized apparatus having a processor, the processor being adapted to perform the steps of: obtaining a description of a test suite which comprises a plurality of tests, wherein each test of the test suite is described by values of functional attributes, wherein at least a portion of the functional attributes are setup-related attributes, wherein a combination of values of the setup-relates attributes potentially indicate a setup activity to be performed prior to executing the test to set up a test environment for the test; identifying, based on the description of the test suite, a setup activity that is associated with two or more tests, wherein the setup activity is configured to set up a component of the test environment; providing a first instruction to perform the setup activity prior to executing a first test of the two or more tests; and providing a second instruction to reuse the component of the test environment when executing additional tests of the two or more tests, whereby avoiding performing duplicate setup activities.

Yet another exemplary embodiment of the disclosed subject matter is a computer program product comprising non-transitory computer readable medium retaining program instructions, which instructions when read by a processor, cause the processor to perform a method comprising: obtaining a description of a test suite which comprises a plurality of tests, wherein each test of the test suite is described by values of functional attributes, wherein at least a portion of the functional attributes are setup-related attributes, wherein a combination of values of the setup-relates attributes potentially indicate a setup activity to be performed prior to executing the test to set up a test environment for the test; identifying, based on the description of the test suite, a setup activity that is associated with two or more tests, wherein the setup activity is configured to set up a component of the test environment; providing a first instruction to perform the setup activity prior to executing a first test of the two or more tests; and providing a second instruction to reuse the component of the test environment when executing additional tests of the two or more tests, whereby avoiding performing duplicate setup activities.

BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
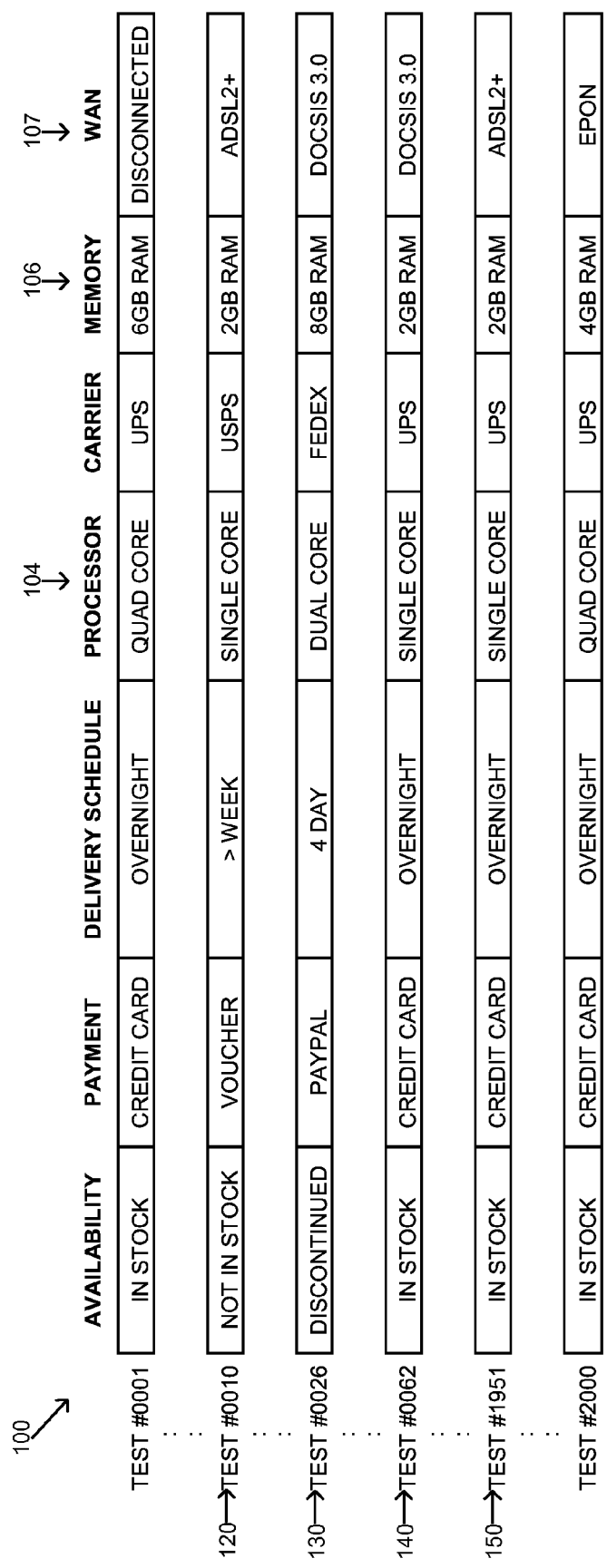
FIG. 1 shows an illustration of a test suite description, in accordance with some embodiments of the disclosed subject matter.

The disclosed subject matter is described below with reference to flowchart illustrations and/or block diagrams of methods, apparatus (systems) and computer program products according to embodiments of the subject matter. It will be understood that some blocks of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

In the present disclosure a "setup activity" is a pre-test activity preformed to set up one or more components of a test environment prior to executing each test of the test suite. The setup activities of a test may be indicated by a combination of the values of a portion of the functional attributes describing the test. In some exemplary embodiments, the setup activity may be defined by a combination of values of setup-related attributes. Setup activity may be manual, semi automatic or automatic. In some exemplary embodiments, the setup activity may set up a hardware device, a virtual machine, a data repository, or a similar component. For example, the setup activity may be hardware configuration (e.g., installing hardware components, connecting units, or the like), virtual machine configuration, data repository preparation (e.g., updating the data retained in a data repository), a combination thereof, or the like. In some exemplary embodiments, the setup activity may set up a hardware device, a virtual machine, or a data repository.

It should be noted that in the present disclosure the term "setup activity" may refer to any setup activity that is performed to set up one or more components of the test environment. The test environment of each test of the test suite may comprise multiple components, each of which may have a setup activity. In some exemplary embodiments, multiple components may be set up by the same setup activity. As an example, a test environment for a test may require setting up three hardware components. A first component may be set up using a first setup activity, while second and third components may be set up using a second setup activity.

For the sake of simplicity, the present disclosure may refer to a setup activity as setting up a test environment, instead of more accurately referring to setting up the components of the test environment.

In some exemplary embodiments of the disclosed subject matter, redundant and duplicate preparation of the setup activities may be prevented by reusing an existing component of the test environment prior to executing different tests having identical component in their test environment.

In the present disclosure, a "functional attribute" is an attribute of a test representing any functional aspect of the test. The functional attribute may be associated with a domain. A combination of values to all functional attributes may describe a test. A subset (portion) of the functional attribute may indicate the setup activity configured to setup the test environment. The subset of the functional attribute that indicate the setup activity may be referred to as "relevant functional attributes"

In the present disclosure, a "duplicate setup activity" is a setup activity that is used to set up the same test environment or at least one component thereof, for two or more tests of the test suite. An example for a duplicate setup activity is depicted in FIG. 1. In FIG. 1, a processor and a memory of a hardware component (e.g., server) are repeatedly configured to single core processor and 2 GB RAM in three tests: Test #0010 (120), Test #0062 (140) and Test #1951 (150). Another duplicate setup activity is a setup activity of a dual core processor and 8 GB RAM is depicted in Test #0026 (130). Yet another duplicate setup activity, wherein a WAN is configured to ADSL2+ is depicted in both Test #0010 (120) and Test #1951 (150). It should be noted that each duplicate setup activity may be associated with setting up a different test environment (or at least one component thereof).

A test, such as but not limited to a test script, may have instructions for setting up one or more test environments to be used in the test and for testing the system. The instructions may be, for example, manual instructions to the user, automatic instructions to a computerized device, a combination thereof, or the like. The instructions may include test information, guidelines, test procedures, a configuration guide, or the like. In some exemplary embodiments, instructions may indicate performing a setup activity to set up at least one component of the test environment, reusing the at least one component of the test environment, eliminating the test environment, or the like.

One technical problem dealt with by the disclosed subject matter is the burden of performing a setup activity prior to running each test of the test suite. In some exemplary embodiments, certain aspects of the setup activity of two or more tests may result in setting the same one or more components of the test environment. Such duplicate setup activities may be repeated for different tests of the test suite, which will subsequently extend the overall tests duration and inflate the cost with unnecessary resources.

One technical solution is reusing the one or more components of the test environment that were previously set up by a setup activity of another test of the test suite. Put differently, in case both a first test and a second test require the same setup activity to be performed, the setup activity may be performed prior to executing the first test and when executing the second test, the one or more components of the test environment created by the setup activity may be reused. The one or more components of the test environment may be reused for all the tests of the test suite, which were identified to have the same setup activity, as the first test. The identification of the setup activity may utilize a processor to analyze a test description comprising valuations of the functional attributes. In some cases, values of a portion of the functional attributes may indicate a setup activity to be performed prior to running the test, thereby allowing identification of two or more tests that share the same setup activity.

In some exemplary embodiments, a name may be assigned to each component of a test environment. The name of the component of a test environment may be used to instruct the user to reuse an existing component of a test environment prior to executing a test and avoid duplicating the setup activity.

Additionally or alternatively, upon completion of executing the tests of the test suite some or all of the setup activities may be eliminated. In some exemplary embodiments, after a last test that is associated with the same test environment is performed, a last instruction may be performed, such as cleanup instruction, test environment elimination instruction, or the like.

One technical effect of the disclosed subject matter is enhancing the test planning methodology. In some exemplary embodiments the methodical preparation of the test environment prior to executing the tests enables the reuse of one or more components of the test environment. Reusing the one or more components of the test environment for all the tests identified to have the same setup activity may reduce omissions, redundancy of test preparations, cost of hardware and execution time.

Referring now to FIG. 1 showing an illustration of a test suite description, in accordance with some embodiments of the disclosed subject matter. Table 100 may be an illustration of the test suite description, in accordance with some exemplary embodiments of the disclosed subject matter.

In some exemplary embodiments, Table 100 may comprise any number of different tests to be performed. As is exemplified in FIG. 1 there are 2000 different tests. Each row of Table 100, such as for example, Row 120, corresponds to a single test of the test suite. Each row may characterize or define the test using the functional attributes.

In some exemplary embodiments, Table 100 may comprise columns. Each column represents a different functional attribute, such as for example, Column 104, may represent a functional attribute named "processor". A value may be assigned to each functional attribute. In some exemplary embodiments, the functional attribute may be an attribute of a test representing any functional aspect of the test. The values assigned to the functional attributes of a single row may together define the test.

In accordance with some exemplary embodiments of the disclosed subject matter, one or more functional attributes may optionally define a setup activity to be performed prior to executing the test. The setup activity of a test may be determined from a portion of a single row comprising the one or more functional attributes.

In some exemplary embodiments, the setup activity may be determined based on the values of the functional attributes. As an example, Column 104 indicating a processor configuration and Column 106 indicating a memory configuration may define a first setup activity. Column 107 indicating a WAN setup may define a second setup activity.

In some exemplary embodiments, Row 120 may comprise the values of the functional attributes describing Test #0010. A portion of the functional attributes of Test #0010 may indicate one or more setup activities to be performed prior to executing Test #0010. The setup activity of Test #0010 may be configured for example to setup the test environment to a single core processor, 2 GB RAM Memory and an ADSL2+ WAN setup.

In some exemplary embodiments, Row 130 may comprise the values of the functional attributes describing Test #0026. The setup activity of Test #0026 may be configured, for example, to setup the test environment to a dual core processor, 8 GB RAM Memory and DOCSIS 3.0 WAN setup.

In some exemplary embodiments, Row 140 may comprise the values of the functional attributes describing Test #0062. The setup activity of Test #0062 may be configured, for example, to setup the test environment to a single core processor, 2 GB RAM Memory and a DOCSIS 3.0 WAN setup.

In some exemplary embodiments, Row 150 may comprise the values of the functional attributes describing Test #1951. The setup activity of Test #1951 may be configured, for example, to setup the test environment to a single core processor, 2 GB RAM Memory and an ADSL2+WAN setup.

It should be noted that Table 100 may define identical setup activities for two or more tests. Tests #0010, #0062, #1951 define a first identical setup activity with respect to a computer setups as they all require a single core processor and 2 GB RAM memory. Tests #0010 and #1951 define a second identical setup activity in which the communication is set for WAN=ADSL2+.

Figure 2A:
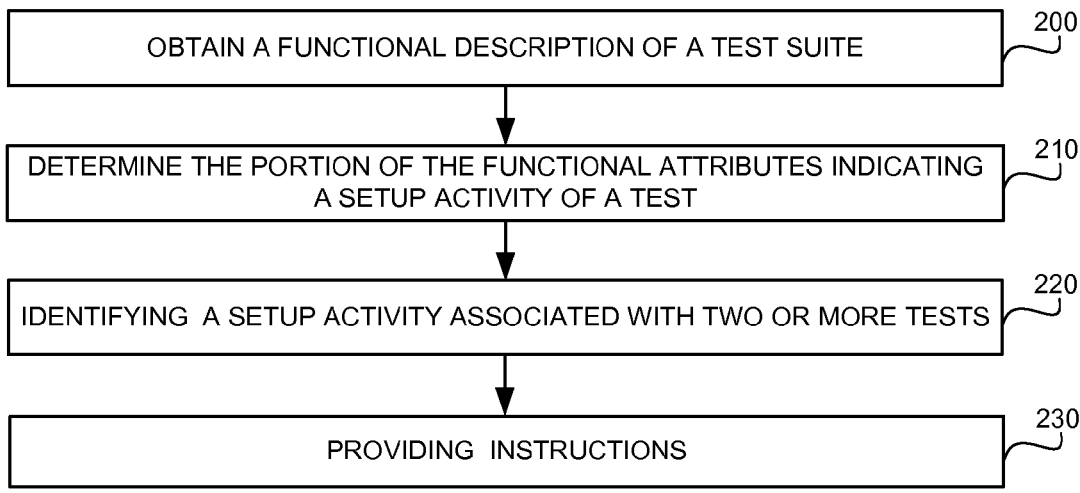
FIGS. 2A and 2B show flowchart diagrams of methods, in accordance with some embodiments of the disclosed subject matter.

Referring now to FIG. 2A showing a flowchart of a method, in accordance with some embodiments of the disclosed subject matter.

In Step 200, a functional description of a test suite may be obtained. The test suite may comprise a plurality of tests, each of which may be defined by a combination of values of functional attributes. The values assigned to the functional attributes of a single test may together form the test description of that test. In some exemplary embodiments, the functional description may be retrieved from a computer readable medium provided by the user, downloaded from a testing server, or the like.

In Step 210, a portion of the functional attributes indicating the setup activity of a test may be determined. The portion indicating a setup activity may be values of one or more functional attributes of the test description. For example, the values of the functional attributes indicating the setup activity of Test #0010 of FIG. 1 may be for example a single core processor, 2 GB RAM memory and ADSL2+WAN setup. In some exemplary embodiments, the setup activities may be hardware configuration, virtual machine configuration, data repository preparation, a combination thereof, or the like. In some exemplary embodiments, a single test may be associated with two or more setup activities, each associated with setting up a component of the test environment. For simplicity, the disclosure herein refers to a single setup activity. However, the disclosed subject matter is not limited to a single setup activity for a test.

In some exemplary embodiments, each setup activity may be associated with a number of attributes that is bounded by a predetermined bound, such as a user-defined interaction level.

In Step 220, a setup activity associated with two or more tests may be identified. The identification may be performed by a processor configured to inspect the values of the portion of the functional attributes. In accordance with some exemplary embodiments of the disclosed subject matter, the setup activity may be configured to set a test environment. The test environment that is being set up by the setup activity may be comprised of hardware, virtual machine, data repository, a combination thereof, or the like. As an example, Test #0010, Test #0062 and Test #1951 of FIG. 1 may be identified as requiring a same setup activity, for example, processor and memory configured to single core processor and 2 GB RAM Memory. As another example, Test #0010 and Test #1951 of FIG. 1 may have identical communication setup activity subset configured to WAN=ADSL2+.

In Step 230, instructions may be provided. The instructions may be provided in user readable form, in computer readable form, or the like. The instructions may be configured to be manually performed by a user. Additionally or alternatively, the instructions may be configured to be automatically performed by a computerized device upon executing the instructions.

A first instruction may be provided to a user performing the setup of a test environment prior to executing the first test of tests with identical setup activity, which was identified in Step 220. In some exemplary embodiments, the instructions may comprise testing information, guidelines, testing procedures, a configuration guide, preparating a combination thereof, or the like.

A second instruction may be provided to the user to reuse one or more components of the test environment when executing additional tests of tests having the same setup activity. In some exemplary embodiments, a name may be assigned to one or more component of the test environment. The name of the one or more components of the test environment may be used in the second instruction to instruct the user to reuse one or more components of test environment specified by the name when executing the test. In some exemplary embodiments, Assignment of names to components of the test environment may be done by generating the name based on a template associated with a portion of the values of functional attributes. Generating the name may utilize explicit naming rules, using names of components, values of the functional attributes, or the like. The name may be used as a part of the combination name, and additional sequential numbers, or strings from a list, for example, "Hardware 1", "Hardware 2", or the like. As an example, a virtual machine with parameters for number of CPUs, size of memory, type of storage, and type of network, may be defined. At the first time a combination of parameter values is used, the virtual machine may be created and given a name, such as Conf-1. In subsequent times the same virtual machine is used, the instruction may refer to the component of the test environment by name, such as by providing the instruction "Apply operation=X to Conf-1". In some exemplary embodiments, the names may be defined automatically based on the attributes and their valuation which define the setup activity. Referring again to the virtual machine above, the name may be "virtual machine CPU=4, Memory=4 GB, Storage=HDD, Network=LAN".

A third instruction may be provided to the user. The third instruction may provide guidance to activities to perform upon completing the execution of the last test of the tests having identical setup activity. In some exemplary embodiments, the third instruction may be an instruction to eliminate the test environment, such as for example, erase entries from the data repository, destroy the virtual machine, disassemble the hardware configuration, a combination thereof, or the like.

Figure 2B:
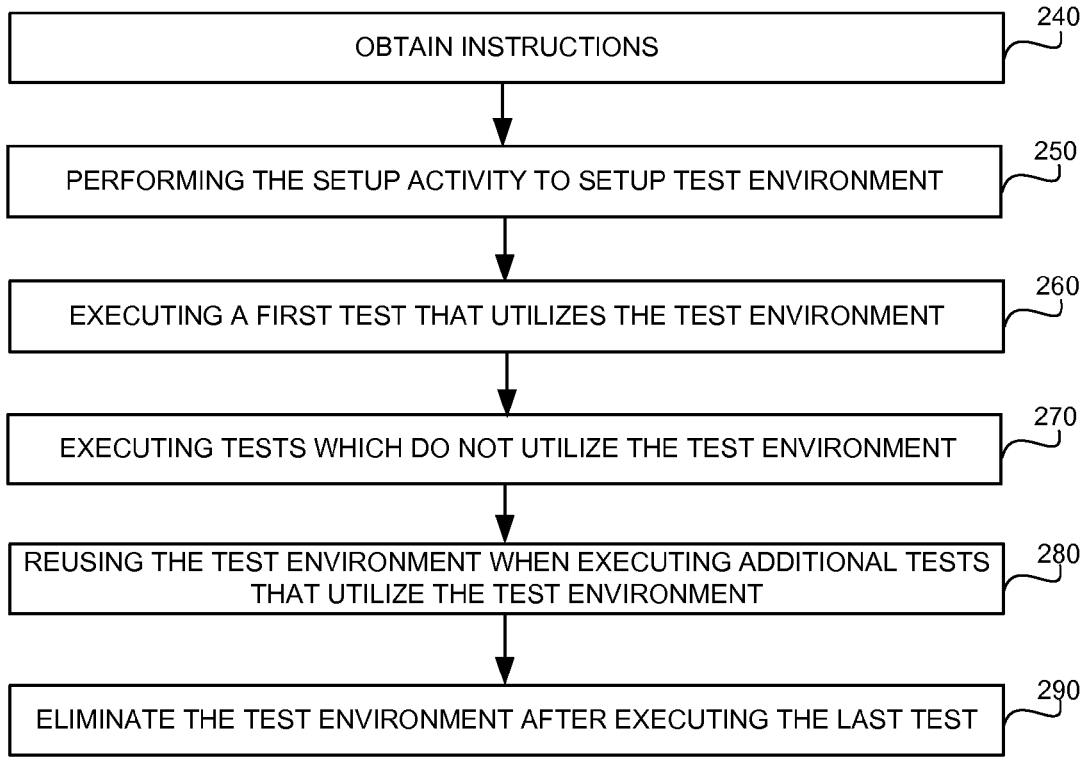

Referring now to FIG. 2B showing a flowchart of a method, in accordance with some embodiments of the disclosed subject matter.

In Step 240, the instructions may be obtained. The instructions may be obtained by the user performing the setup of a test environment prior to executing the first test of tests with identical components of the test environment. In some exemplary embodiments, the instructions may be obtained from a computer readable medium.

In Step 250, a setup activity to setup the test environment may be performed by the user. In some exemplary embodiments, the user may perform the setup activity provided in the first instruction to setup the test environment. The setup activity may comprise hardware configuration, virtual machine configuration, data repository preparation, a combination thereof, or the like.

In Step 260, a first test that utilizes the test environment may be executed. In some exemplary embodiments, the first test of the test suite is the first test that is associated with the duplicate setup activity. As an example Test #0010 of FIG. 1 may be the first test that requires creation of the test environment characterized by a single core processor and 2 GB memory.

In Step 270, tests which are not utilizing the test environment may be executed. It will be understood that these tests may require setup activities that may or may not be shared with other tests. For simplicity of the disclosure, the specification refers to a single shared setup activity. In some exemplary embodiments, tests not requiring the setup activity of Step 250 may or may not have a unique setup activity. A unique setup activity does not share a setup activity with any of the tests in the test suite. As an example, Test #0001 and Test #2000 of FIG. 1 each have a unique setup activity.

In Step 280, one or more components of the test environment may be reused when executing an additional test utilizing the same one or more components of test environment. In some exemplary embodiments, reusing one or more components of the test environment may be in accordance to the second instruction for the additional test. Instead of performing the duplicate setup activity (e.g., the setup activity of Step 260), one or more components of the test environment created in Step 250 may be reused. As an example, Step 280 may refer to reuse of one or more components of the test environment of Test #0001 when performing Test #0062 and Test #1951.

In Step 290, the test environment may be eliminated after executing the last test. The elimination of the test environment may be performed according to the third instruction upon completion of executing the last test of the tests having identical one or more components of test environment. In some exemplary embodiments, the third instruction may be an instruction to eliminate the test environment, such as for example, erase entries from the data repository, destroy the virtual machine, disassemble the hardware configuration a combination thereof, or the like. In some exemplary embodiments, other instructions may be provided for other finish-up activities after the last usage of the test environment of the setup activity.

Figure 3:
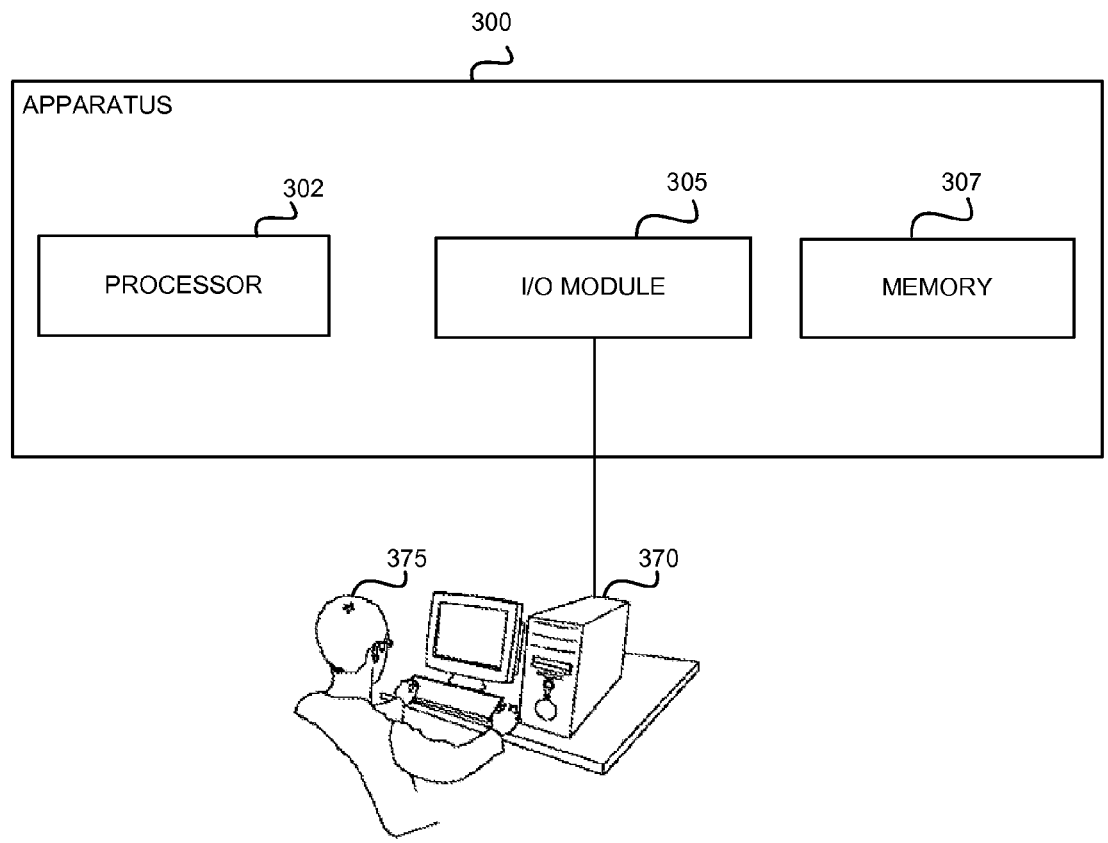
FIG. 3 shows a schematic illustration of an apparatus, in accordance with some embodiments of the disclosed subject matter.

Referring now to FIG. 3 showing a block diagram of components of an apparatus, in accordance with some exemplary embodiments of the disclosed subject matter.

An Apparatus 300 may be configured to determine setup activities, identify setup activities and generate instructions to setup test environment, or the like.

In some exemplary embodiments, Apparatus 300 may comprise a Processor 302. Processor 302 may be a Central Processing Unit (CPU), a microprocessor, an electronic circuit, an Integrated Circuit (IC) or the like. Processor 302 may be utilized to perform computations required by Apparatus 300 or any of it subcomponents. Processor 302 may be configured to execute computer-programs useful in performing the method of FIGS. 2A and 2B.

In some exemplary embodiments of the disclosed subject matter, Apparatus 300 may comprise an Input/Output (I/O) Module 305. I/O Module 305 may be utilized to provide an output to and receive input from User 375. However, it will be understood the Apparatus 300 may be utilized without user intervention In some exemplary embodiments, I/O Module 305 may be utilized to obtain, such as from a digital source, from a user, or the like, a functional model, a test plan, relevant functional attributes to a test validation activity, or the like. In some exemplary embodiments, I/O Module 305 may be used to output instructions 230, such as in a form of a computer-readable medium, as a printed report, as an output in a display, or the like.

In some exemplary embodiments, a User 375, such as a developer, a QA staff member, a tester, a designer, a verification engineer or the like, may interact with Apparatus 300. User 375 may be utilizing a Man-Machine Interface (MMI) 370, such as a terminal, a display, a keyboard, an input device or the like, to interact with Apparatus 300. In some exemplary embodiments, User 375 may perform the setup activity to setup the test environment in accordance with the provided instructions.

In some exemplary embodiments, Apparatus 300 may comprise a Memory Unit 307. Memory Unit 307 may be a short-term storage device or long-term storage device. Memory Unit 307 may be a persistent storage or volatile storage. Memory Unit 307 may be a disk drive, a Flash disk, a Random Access Memory (RAM), a memory chip, or the like. In some exemplary embodiments, Memory Unit 307 may retain program code operative to cause Processor 302 to perform acts associated with any of the subcomponents of Apparatus 300. In some exemplary embodiments, Memory Unit 307 may retain program code operative to cause Processor 302 to perform acts associated with any of the steps shown in FIGS. 2A and/or 2B.

In some exemplary embodiments, Memory Unit 307 may retain code, which, when executed by Processor 302, causes Processor 302 to determine the setup activity portion for each test of a test suite and to identify two or more tests of the test suite having an identical setup activities or a subset thereof. The code may be useful to generate instructions, assign names to setup activities, or the like.

In some exemplary embodiments, Memory Unit 307 may retain a data repository and a code, which, when executed by Processor 302, causes Processor 302 to allow a user to define the data repository. In some exemplary embodiments, the data repository may be retained in a different storage device.

In some exemplary embodiments, Memory Unit 307 may retain code, which, when executed by Processor 302, causes Processor 302 to display to a user, using a User Interface (UI), the test suite, setup activities determined by Apparatus 300, the instructions, and/or the like.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of program code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method comprising:
obtaining a functional model of a test suite, wherein the test suite comprises a plurality of tests, wherein the functional model comprising functional attributes, respective domains of values for each functional attribute, and restrictions on value combinations of the functional attributes, wherein each test of the test suite is described by values of the functional attributes of the functional model, wherein at least a portion of the functional attributes of the functional model are setup-related attributes, wherein a combination of values of the setup-related attributes potentially indicate a setup activity to be performed prior to executing the test to set up a test environment for the test, wherein the functional attributes comprise at least two functional attributes that are not setup-related attributes;
automatically identifying, in the functional model, a setup activity that is associated with two or more tests, wherein the setup activity is configured to set up a component of the test environment, wherein said identifying is performed by a processor;
providing a first instruction to perform the setup activity prior to executing a first test of the two or more tests; and
providing a second instruction to reuse the component of the test environment when executing additional tests of the two or more tests;
wherein said automatically identifying, said providing the first instruction and said providing the second instruction are performed prior to executing the first test and prior to executing the additional tests;
whereby avoiding performing duplicate setup activities.

2. The computer-implemented method of claim 1 further comprising:
performing the setup activity in accordance with the first instruction;
executing the first test of the two or more tests, wherein the first test utilizes the component which was set up by the setup activity; and
executing the additional tests of the two or more tests, wherein the additional tests reuse the component which was set up by the setup activity.

3. The computer-implemented method of claim 1 further comprising:
assigning a name to the component of the test environment and utilizing the name in the second instruction to indicate reuse of the test environment.

4. The computer-implemented method of claim 3, wherein said assigning a name comprises generating the name based on a template associated with a portion of the values of functional attributes.

5. The computer-implemented method of claim 1, wherein said identifying is performed by selecting a subset of the test suite based on a target level interaction, wherein said selecting is performed so as the subset provides that same coverage as the test suite with respect to the target level interaction.

6. The computer-implemented method of claim 1, further comprising providing a third instruction associated with executing the last test of the two or more tests.

7. The computer-implemented method of claim 6, wherein the third instruction is an instruction to eliminate the test environment after execution of the last test.

8. The computer-implemented method of claim 7, wherein eliminating the test environment is performed by an action selected from the group consisting of: dismantling hardware setup; destroying a virtual machine; and erasing one or more entries from a data repository.

9. The computer-implemented method of claim 1, wherein the setup activity is an activity selected from a group consisting of: hardware configuration; virtual machine configuration; and data repository preparation.

10. A computerized apparatus having a processor, the processor being adapted to perform the steps of:
obtaining a functional model of a test suite, wherein the test suite comprises a plurality of tests, wherein the functional model comprising functional attributes, respective domains of values for each functional attribute, and restrictions on value combinations of the functional attributes, wherein each test of the test suite is described by values of functional attributes of the functional model, wherein at least a portion of the functional attributes of the functional model are setup-related attributes, wherein a combination of values of the setup-related attributes potentially indicate a setup activity to be performed prior to executing the test to set up a test environment for the test, wherein the functional attributes comprise at least two functional attributes that are not setup-related attributes;
automatically identifying, in the functional model, a setup activity that is associated with two or more tests, wherein the setup activity is configured to set up a component of the test environment;
providing a first instruction to perform the setup activity prior to executing a first test of the two or more tests; and
providing a second instruction to reuse the component of the test environment when executing additional tests of the two or more tests;
wherein said automatically identifying, said providing the first instruction and said providing the second instruction are performed prior to executing the first test and prior to executing the additional tests;
whereby avoiding performing duplicate setup activities.

11. The computerized apparatus of claim 10, wherein the setup activity is performed in accordance with the first instruction, wherein the processor is further adapted to perform the steps of:
executing the first test of the two or more tests, wherein the first test utilizes the component which was set up by the setup activity; and
executing the additional tests of the two or more tests, wherein the additional tests reuse the component which was set up by the setup activity.

12. The computerized apparatus of claim 10, wherein the processor is further adapted to perform the steps of:
assigning a name to the component of the test environment and utilizing the name in the second instruction to indicate reuse of the test environment.

13. The computerized apparatus of claim 12, wherein said assigning a name comprises generating the name based on a template associated with a portion of the values of functional attributes.

14. The computerized apparatus of claim 10, wherein said identifying is performed by selecting a subset of the test suite based on a target level interaction, wherein said selecting is performed so as the subset provides that same coverage as the test suite with respect to the target level interaction.

15. The computerized apparatus of claim 10, wherein the processor is further adapted to perform the step of: providing a third instruction associated with executing the last test of the two or more tests.

16. The computerized apparatus of claim 15, wherein the third instruction is an instruction to eliminate the test environment after execution of the last test.

17. The computerized apparatus of claim 16, wherein eliminating the test environment is performed by an action selected from the group consisting of: dismantling hardware setup; destroying a virtual machine; and erasing one or more entries from a data repository.

18. The computerized apparatus of claim 10, wherein the setup activity is an activity selected from a group consisting of: hardware configuration; virtual machine configuration; and data repository preparation.

19. A computer program product comprising non-transitory computer readable medium retaining program instructions, which instructions when read by a processor, cause the processor to perform a method comprising:
   obtaining a functional model of a test suite, wherein the test suite comprises a plurality of tests, wherein the functional model comprising functional attributes, respective domains of values for each functional attribute, and restrictions on value combinations of the functional attributes, wherein each test of the test suite is described by values of functional attributes of the functional model, wherein at least a portion of the functional attributes of the functional model are setup-related attributes, wherein a combination of values of the setup-related attributes potentially indicate a setup activity to be performed prior to executing the test to set up a test environment for the test, wherein the functional attributes comprise at least two functional attributes that are not setup-related attributes;
automatically identifying, in the description of the test suite, a setup activity that is associated with two or more tests, wherein the setup activity is configured to set up a component of the test environment;
providing a first instruction to perform the setup activity prior to executing a first test of the two or more tests; and
providing a second instruction to reuse the component of the test environment when executing additional tests of the two or more tests;
wherein said automatically identifying, said providing the first instruction and said providing the second instruction are performed prior to executing the first test and prior to executing the additional tests;
whereby avoiding performing duplicate setup activities.

* * * * *